(12) United States Patent
Hwang et al.

(10) Patent No.: US 9,391,601 B2
(45) Date of Patent: Jul. 12, 2016

(54) GATE DRIVER FOR ISOLATED INPUT SWITCHING DEVICE

(71) Applicant: MAPS, INC., Yongin-si (KR)

(72) Inventors: Jong-Tae Hwang, Seoul (KR); Hyun-Ick Shin, Seoul (KR); Sang-O Jeon, Suwon-si (KR); Joon Rhee, Seoul (KR)

(73) Assignee: MAPS, Inc., Yongin-si (KR)

(*) Notice: Subject to any disclaimer, the term of this patent is extended or adjusted under 35 U.S.C. 154(b) by 0 days.

(21) Appl. No.: 14/785,160

(22) PCT Filed: Mar. 10, 2014

(86) PCT No.: PCT/KR2014/001964
§ 371 (c)(1),
(2) Date: Oct. 16, 2015

(87) PCT Pub. No.: WO2014/171633
PCT Pub. Date: Oct. 23, 2014

(65) Prior Publication Data
US 2016/0072498 A1 Mar. 10, 2016

(30) Foreign Application Priority Data
Apr. 19, 2013 (KR) .................. 10-2013-0043721

(51) Int. Cl.
*H03B 1/00* (2006.01)
*H03K 3/00* (2006.01)
*H03K 17/16* (2006.01)

(52) U.S. Cl.
CPC .................. *H03K 17/162* (2013.01)

(58) Field of Classification Search
CPC ... H03K 17/063; H03K 17/74; H03K 17/166; H03K 17/302; H03K 17/687; H03K 3/012
USPC ................ 327/108–112, 427, 434, 437, 382; 326/82, 83
See application file for complete search history.

(56) References Cited

U.S. PATENT DOCUMENTS

| 5,134,320 | A | * | 7/1992 | Perusse | H02M 1/34 327/382 |
| 7,671,660 | B2 | * | 3/2010 | Van Acht | H03K 19/017 326/88 |
| 2008/0309400 | A1 | * | 12/2008 | van der Wagt | G11C 27/02 327/551 |
| 2013/0214824 | A1 | * | 8/2013 | Umetani | H03K 17/145 327/109 |

FOREIGN PATENT DOCUMENTS

| KR | 10-0138306 B1 | 2/1998 |
| KR | 10-2007-0019834 A | 2/2007 |
| KR | 10-2008-0072588 A | 8/2008 |
| KR | 10-2009-0006785 A | 1/2009 |

OTHER PUBLICATIONS

International Search Report Issued on Jun. 12, 2014, in counterpart of International Application No. PCT/KR2014/001964, 3 pages.

* cited by examiner

*Primary Examiner* — Lincoln Donovan
*Assistant Examiner* — Thomas Skibinski
(74) *Attorney, Agent, or Firm* — NSIP Law

(57) ABSTRACT

A gate driver driving a switching device is disclosed. The gate driver includes a capacitor which is coupled to the input of the switching device. The gate drive power consumption is reduced by this additional capacitor.

5 Claims, 15 Drawing Sheets

(a)

(b)

GATE DRIVER FOR ISOLATED INPUT SWITCHING DEVICE

CROSS-REFERENCE TO RELATED APPLICATIONS

This application is a National Stage of International Application No. PCT/KR2014/001964, filed Mar. 10, 2014 and published as WO 2014/171633 A1 on Oct. 23, 2014, which claims the benefit of Korean Patent Application No. 10-2013-0043721, filed on Apr. 19, 2013, the entire disclosures of which are incorporated herein by reference for all purposes.

TECHNICAL FIELD

The present invention relates to a gate driver for switching device, and more particularly, to a gate driver for improving driving efficiency of a switching device.

BACKGROUND ART

FIG. 1 is a diagram illustrating an inductor-inductor-capacitor (LLC) resonant inverter circuit consisting of conventional MOSFET switches.

In the LLC resonant inverter circuit as shown in FIG. 1, MOSFET switch M1 and MOSFET switch M2 are alternately switched to supply energy to the load. In this case, if M1 and M2 are driven at a switching frequency which is higher than a resonant frequency that is determined by an inductor L1, a capacitor C1, and a magnetizing inductance, the switches can be turned ON when the drain-source voltage of either M1 or M2 is almost zero. Such an operation is referred to as a "zero-voltage switching (ZVS)". By performing a ZVS operation, not only can switching loss of switches be minimized, but also electromagnetic interference can be reduced.

FIG. 2 is a circuit diagram of a synchronous buck converter of a prior art.

In the synchronous buck converter that is configured as shown in FIG. 2, when M1 is ON, energy is supplied to the load via L1. Then, when MI is OFF, the inductor current free-wheels through M2, and at this time, the drain-source voltage at both ends of M2 nears zero, thus satisfying the ZVS.

FIG. 3 is an equivalent circuit diagram in the case of the ZVS performed using a conventional gate driver.

FIG. 3 shows an equivalent circuit diagram when a switch that satisfies ZVS conditions is turned ON using a conventional gate driver 10. As the ZVS condition, the drain of M1 is at the same potential as the source. In FIG. 3, the drain of M1 is set to ground level. At this time, when M2 is turned ON, M1 is also ON, thereby completing the ZVS. For M1 to be ON, a gate-source parasitic capacitor Cgs and a gate-drain parasitic capacitor Cgd have to be charged above a threshold voltage which causes the MOSFET to be ON. The power $P_{driving}$ which is provided from a power supply VDD is obtained by Equation 1 below.

$$Pdriving = Qg \cdot VDD \cdot f \quad (1)$$
$$= (Cgs + Cgd) \cdot VDD^2 \cdot f$$

Since Qg, which denotes charge to be supplied, is (Cgs+Cgd)*VDD, $P_{driving}$ is proportional to the total parasitic capacitance (Cg=Cgs+Cgd) of the gate, as shown in Equation 1. It is also proportional to the square of driving voltage, as well as to a switching frequency. In the case where the driving frequency is low, although gate drive loss is usually negligible compared to conduction loss caused by ON resistance Rdson of the MOSFET, the gate drive loss increases with the rise of the frequency, which means no matter how much Rdosn of the switch is improved, it is not possible to implement a system that has a good efficiency.

Technical Problem

The objective of the present invention is to provide a gate driver which enables reduction in gate drive power consumption resulting from charging a gate during driving of a switching device.

Technical Solution

The present invention provides a gate driver for driving a switching device, the gate driver including a capacitor coupled to an input of the switching device.

The gate driver may be configured to turn ON the switching device by supplying charge through the capacitor, and to discharge the capacitor when turning off the switching device.

The gate driver may be configured to turn ON the switching device by supplying charge through the capacitor; to reserve charge stored in the capacitor when turning off the switching device; and to re-use the charge reserved in the capacitor when controlling the switching device to be turned ON again. The gate driver may be configured to allow the charge preserved in the capacitor to be shared with a parasitic capacitor when the gate driver controls the switching device to be turned ON again. The parasitic capacitor of the switching device may include a gate-source parasitic capacitor and a gate-drain parasitic capacitor of the switching device.

Advantageous Effects

According to the present invention, a gate driver, specifically, a capacitor coupled gate driver (CCGD) and a charge recycle capacitor coupled gate driver (CRCCGD) are both based on a capacitor coupled driver, and, while somewhat increasing the conduction loss, the two still increase the overall efficiency by reducing the gate drive loss at a rate greater than the increase in conduction loss.

According to the present invention, particularly in an application that performs zero-voltage switching and drives, at high speed, switching devices whose inputs are isolated, such as, MOSFET and GaN device, CCGD and CRCCGD with high frequency bring about an efficiency improvement effect in comparison to the existing method.

MODE FOR INVENTION

The above and further aspects of the present invention will be more clearly understood through the accompanying drawings, in which exemplary embodiments of the invention are shown. Hereinafter, the exemplary embodiments are provided to describe the invention in detail such that the invention can be embodied and fully understood by those skilled in the art.

Figure 1:
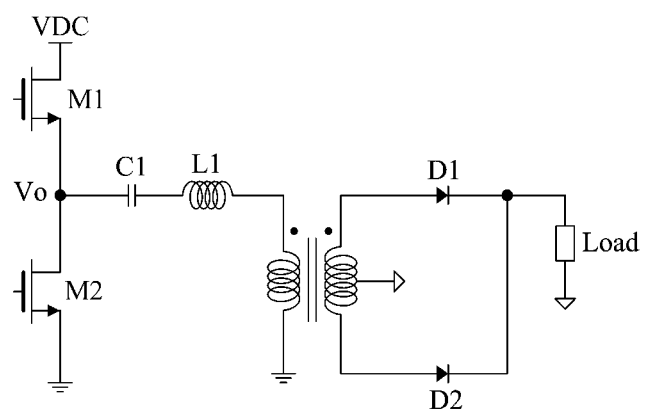
FIG. 1 is a diagram illustrating inductor-inductor-capacitor (LLC) resonant inverter circuit consisting of conventional MOSFET switches.
Figure 2:
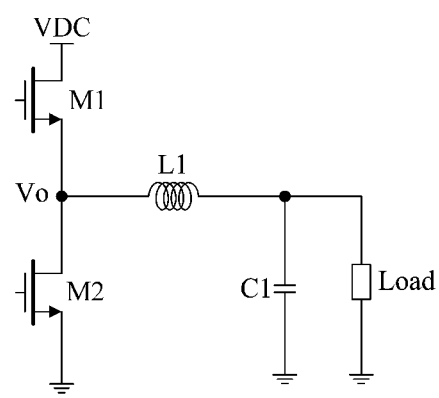
FIG. 2 is a circuit diagram of a synchronous buck converter of a prior art.
Figure 3:
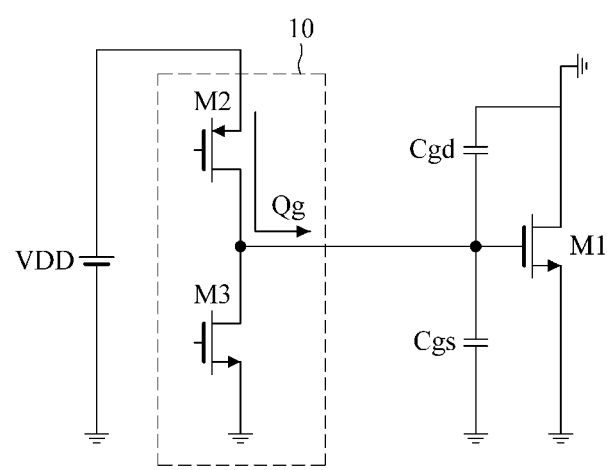
FIG. 3 is an equivalent circuit diagram in the case of the ZVS performed using a conventional gate driver.
Figure 4:
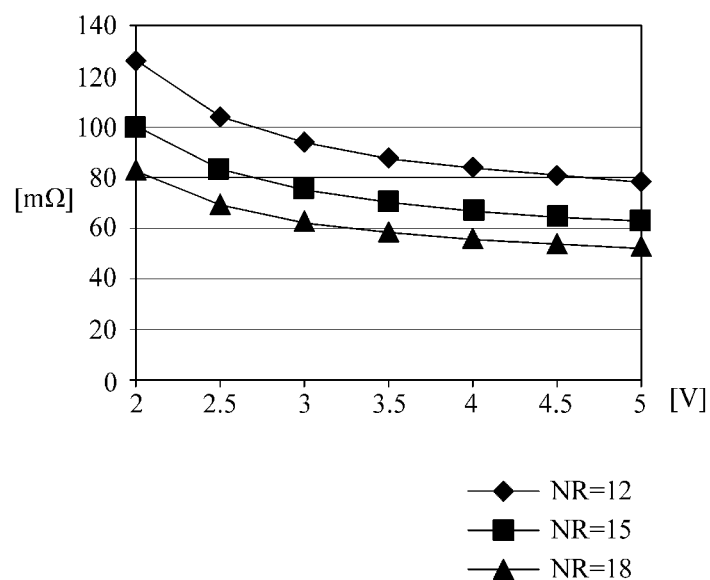
FIG. 4 is a graph showing a gate driving voltage and ON resistance of MOSFET.

FIG. 4 is a graph showing a gate driving voltage and ON resistance of MOSFET.

Figure 5:
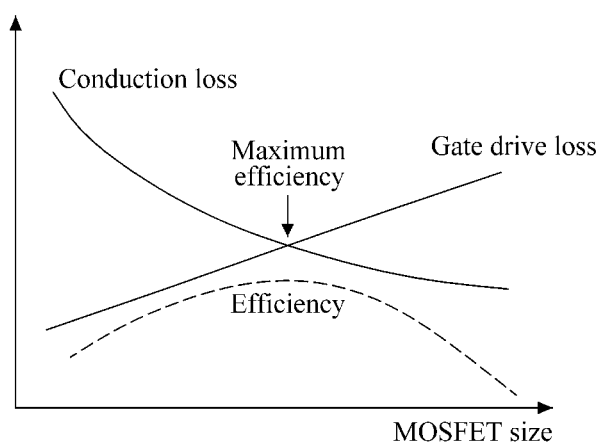
FIG. 5 is a graph showing the maximum efficiency point according to the size of MOSFET.

FIG. 4 is a graph showing ON resistances Rdson of MOSFET according to a gate driving voltage of a 20V lateral double diffused MOS (LDMOS). The X-axis represents a gate driving voltage [V] and the Y-axis represents ON voltage of MOSFET, i.e., Rdson [mOhm]. If the threshold voltage of the 20V LDMOS is set at about 0.8 V, and when the 20V LDMOS is driven above 2 V, a desired ON characteristic can be achieved. In addition, as a gate voltage is increased, Rdson decreases, but not drastically; and even when the voltage is increased, there is only a minimal amount of reduction. A ratio between the width and the length of the MOSFET gate in the graph is 6000*NR/1.3[um/um], wherein it can be seen that as MOSFET increases in size by raising NR, Rdson decreases. As Rdson decreases with the increase of the MOSFET size, conduction loss is also reduced, while the total gate capacitance Cg increases. Therefore, gate drive loss increases, resulting in what can be seen in FIG. 5. Hence, at a point at which two efficiencies meet, the maximum efficiency (i.e., the least loss) can be satisfied. Hereinafter, a switching mechanism that increases the efficiency by reducing gate drive loss will be described in detail.

Figure 6:
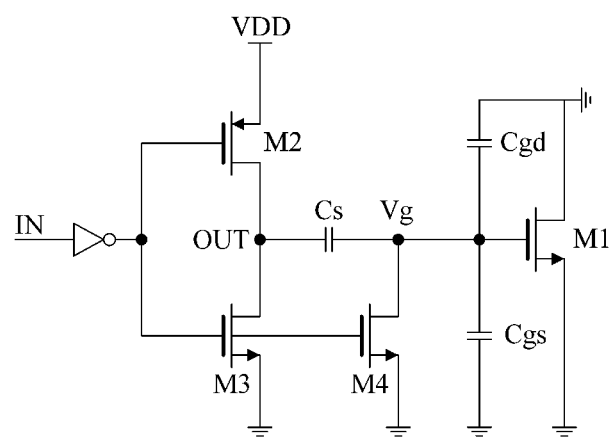
FIG. 6 is a circuit diagram of a gate driver according to an exemplary embodiment of the present invention.
Figure 7:
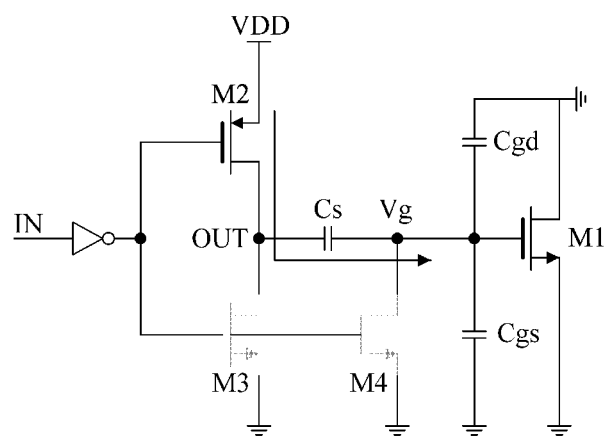
FIG. 7 is a diagram showing principles of operation of the gate driver circuit of FIG. 6.
Figure 7:
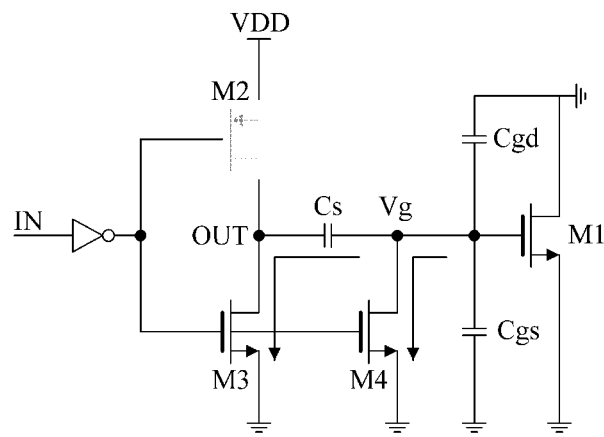

FIG. 6 is a circuit diagram of a gate driver according to an exemplary embodiment of the present invention; and FIG. 7 is a diagram showing principles of operation of the gate driver circuit of FIG. 6.

FIG. 6 represents a capacitor coupled gate driver (CCGD) circuit. The CCGD circuit includes a capacitor Cs that is serially connected between an output terminal of a driver consisting of M2 and M3 and M1. The operation of the CCGD circuit is illustrated in FIG. 7. FIG. 7 (*a*) shows the operation at the time when M1 is turned ON; and FIG. 7 (*b*) shows the operation at the time when M2 is turned OFF. As shown in FIG. 7(*a*), when M2 is turned ON, a charge is supplied through Cs, Vg rises, and M1 is turned ON. When M1 is turned OFF, M3 and M4 both are simultaneously turned ON, Vg becomes zero Volts (Vg=0), and Cs is discharged. If Cs is not discharged, a charge cannot be delivered to M1 gate.

During such operations as above, voltage Vg varies depending on the capacity of Cs. Given that Cg=Cgs+Cgd and Cs is represented as Equation 2, the gate voltage Vg is determined as Equation 3.

$$Cs = \alpha \cdot Cg \quad (2)$$

$$Vg = \frac{\alpha}{1+\alpha} \cdot VDD \quad (3)$$

The total capacitance Ctotal that has to be charged in the power supply is the same as the capacity of serially connected Cs and Cg and is thus represented as Equation 4.

$$Ctotal = \frac{\alpha}{1+\alpha} \cdot Cg \quad (4)$$

Hence, gate drive loss $P_{drv,CCGD}$ due to CCGD may be represented as Equation 5, using Equation 1 and Equation 4.

$$P_{drv,CCGD} = \frac{\alpha}{1+\alpha} \cdot Cg \cdot VDD^2 \cdot f \quad (5)$$

$$= PSF_{CCGD} \cdot Cg \cdot VDD^2 \cdot f$$

Here, PSF stands for Power Save Factor, which indicates a reduction ratio of gate drive loss in comparison to the gate drive loss during the existing driver driving the switch.

As it can be seen from Equation 3, it is possible to control voltage Vg by adjusting the capacity of Cs. As Cs is lowered, voltage Vg falls, and thus conduction loss is increased. As it can be seen from Equation 5, gate drive loss is, however, reduced. As confirmed in FIG. 4, Rdson of MOSFET is not considerably improved when a gate voltage is 2.5 V or higher, and hence the reduction of gate drive loss can be larger, when compared to conduction loss caused by the addition of Cs. If Cs is set by specifying α to satisfy such conditions, the efficiency can be improved. In the case of α=1, given VDD=5 V, Vg becomes 2.5 V. At this time, Rdson increases by about 20% and PSF=½, and thus gate drive loss is reduced by 50%. Thus, 25% of efficiency improvement can be anticipated when the above mechanism is used.

Figure 8:
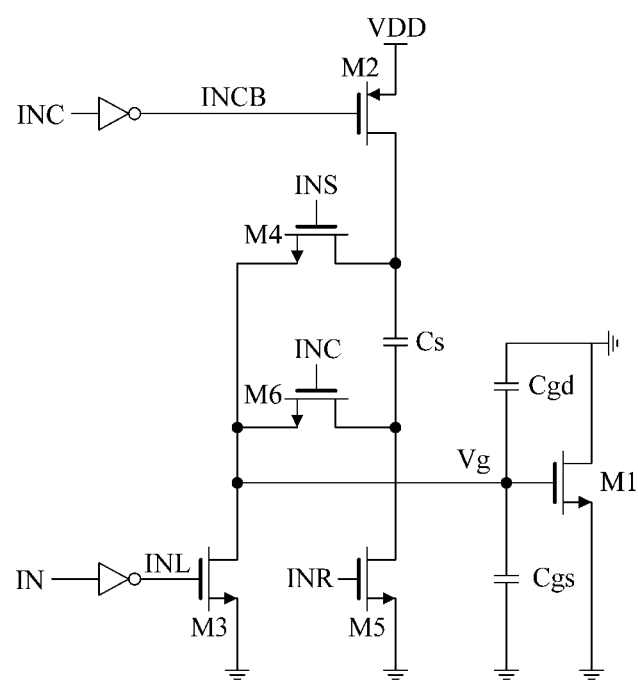
FIG. 8 is a circuit diagram of a gate driver according to another exemplary embodiment of the present invention.

FIG. 8 is a circuit diagram of a gate driver according to another exemplary embodiment of the present invention.

Figure 9:
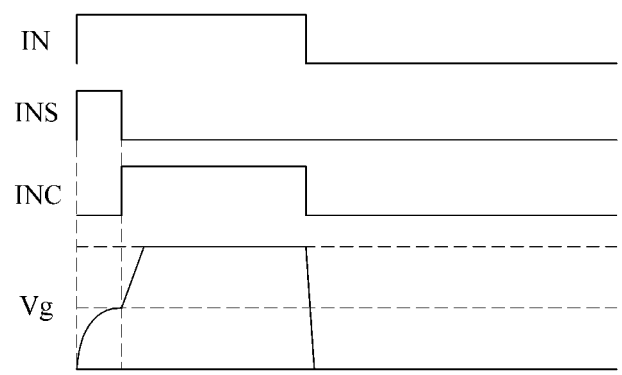
FIG. 9 is a diagram showing driving waveforms of each switch shown in FIG. 8.

FIG. 8 illustrates an enhanced gate driver to improve gate drive loss further. In the gate driver of FIG. 6, when M1 is OFF, Cs charge is discharged, and hence efficiency improvement is not significant. On the other hand, in the gate driver circuit of FIG. 8, the charge stored in Cs is used to charge Cg when M1 which was turned OFF is turned ON again, and hence gate drive loss can be further improved. The gate driver circuit of FIG. 8 is called Charge Recycle Capacitor Coupled Gate Driver (CRCCGD) since it recycles the Cs charge. For reference, FIG. 9 shows driving waveforms of each switch shown in FIG. 8.

Figure 10:
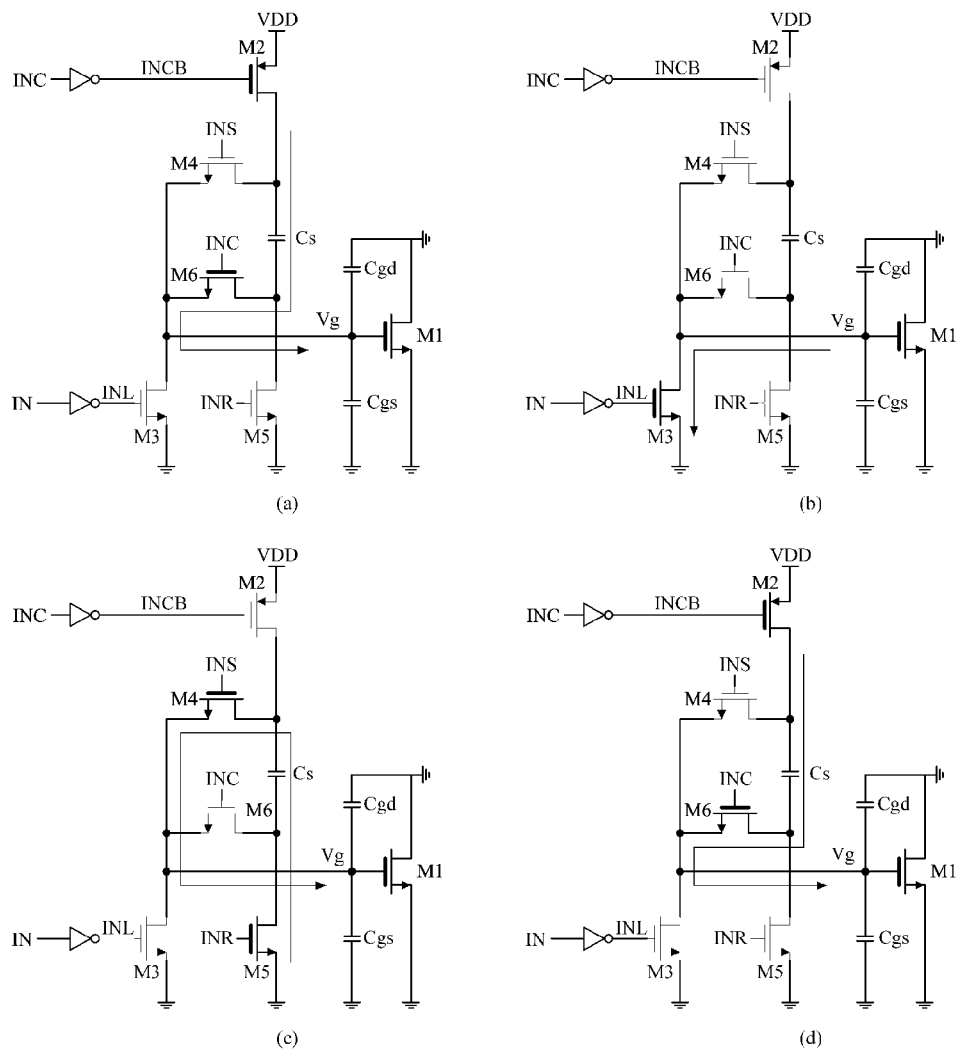
FIG. 10 illustrates circuit diagrams for showing operation principles of the gate driver of FIG. 8.

FIG. 10 illustrates circuit diagrams for showing operation principles of the gate driver of FIG. 8.

As shown in FIG. 10(*a*), in the same manner as CCGD, Cg, to which Cs is serially connected, is charged during the phase in which M1 is fully turned ON. FIG. 10(*b*) shows a state in which M1 is turned OFF. M3 is turned ON and, in turn, Cg is discharged so that M1 is turned OFF, while a discharge path for Cs is not formed and the charge that was stored in Cs in the state as shown in FIG. 10(*a*) is hence preserved. FIG. 10(*c*)

shows the operation of the gate driver when controlling M1 to be turned ON again. Before the gate driver operates as shown in FIG. 10(a), M4 and M5 are turned ON and the charge stored in Cs is shared with Cg. Accordingly, Vg voltage is charged between the maximum voltage and the minimum voltage, as shown in FIG. 9. Thereafter, as shown in FIG. 10(d), M2 is turned ON again to further charge Cg, and Cs is re-charged by the amount of charge shared with Cg.

Figure 11:
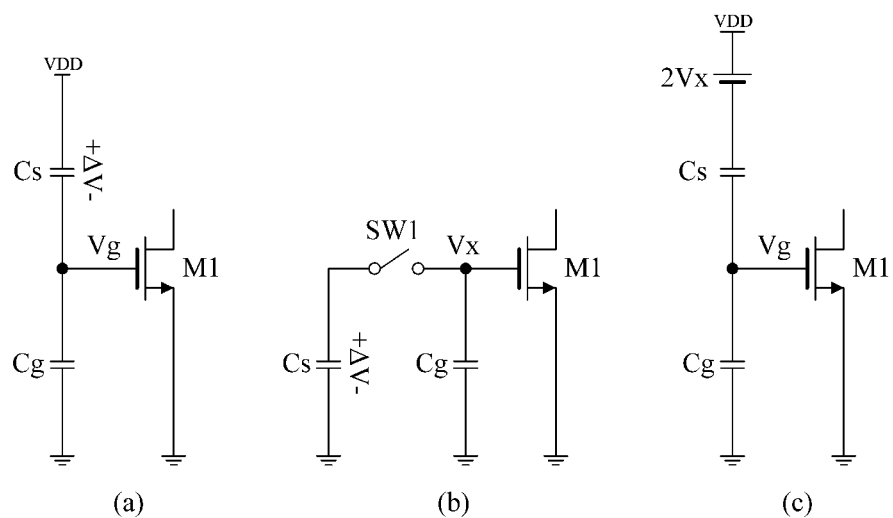
FIG. 11 is a diagram for explaining the analysis of Power Save Factor (PSF) when the gate driver is driven as shown in FIG. 10.

The magnitude of Vg voltage and PSF when the gate driver is driven as described above may be analyzed as below. FIG. 11(a) illustrates an equivalent circuit in a state in which Cs and Cg are fully charged as gate driving has been completed. It is assumed that Cs is a times as large as Cg and a voltage charged in Cs at the time of completion of full charge as shown in FIG. 11(a) is ΔV. In FIG. 11(b), SW1 is turned ON so that the charge in Cs is re-used to charge Cg. Equation 6 below is satisfied according to the charge conservation theory.

$$\alpha \cdot Cg \cdot \Delta V = (1+\alpha) \cdot Cg \cdot Vx \quad (6)$$

Vx voltage of Equation 6 is obtained by Equation 7.

$$Vx = \frac{\alpha}{1+\alpha} \cdot \Delta V \quad (7)$$

FIG. 11(c) is an equivalent circuit when M1 is fully turned ON. Even though charge is supplied from VDD to Cs and Cg, since Cs and Cg has been charged to Vx by the charge recycled as shown in FIG. 11(b), the equivalent circuit, as shown in FIG. 11(c), is obtained. Gate voltage Vg of this equivalent circuit is obtained by Equation 8.

$$Vg = \frac{\alpha}{1+\alpha} \cdot (VDD - 2Vx) + Vx \quad (8)$$

The voltage of Cs is represented as Equation 9.

$$Vcs = \frac{1}{1+\alpha} \cdot (VDD - 2Vx) + Vx \quad (9)$$

Vcs after completion of operation as shown in FIG. 11(c) has to be equal to ΔV of FIG. 11(a). ΔV obtained from Equation 7 and Equation 9 is represented by Equation 10.

$$\Delta V = \frac{1+\alpha}{1+3\alpha} \cdot VDD \quad (10)$$

Voltage Vg obtained from Equation 7, Equation 8, and Equation 10 is represented by Equation 11.

$$Vg = \frac{2\alpha}{1+3\alpha} \cdot VDD \quad (11)$$

In the above switching operation, the operation of supplying the charge from VDD to Cs and Cg corresponds to the operation as shown in FIG. 11(c). The amount of charge supplied from VDD is the product of the capacitor serially connected to Cs and Cg and (VDD−2Vx), and is obtained by Equation 12.

$$Qg = \frac{\alpha}{1+\alpha} \cdot Cg \cdot (VDD - 2Vx) \quad (12)$$
$$= \frac{\alpha}{1+3\alpha} \cdot Cg \cdot VDD$$

The power supplied from VDD is represented as Equation 13.

$$P_{drv,CRCCGD} = Qg \cdot VDD \cdot f \quad (13)$$
$$= \frac{\alpha}{1+3\alpha} \cdot Cg \cdot VDD^2 \cdot f$$
$$= PSF_{CRCCGD} \cdot Cg \cdot VDD^2 \cdot f,$$

where $PSF_{CRCCGD}$, denoting PSF of CRCCGD, is represented as $\alpha/(1+3\alpha)$.

Figure 12:
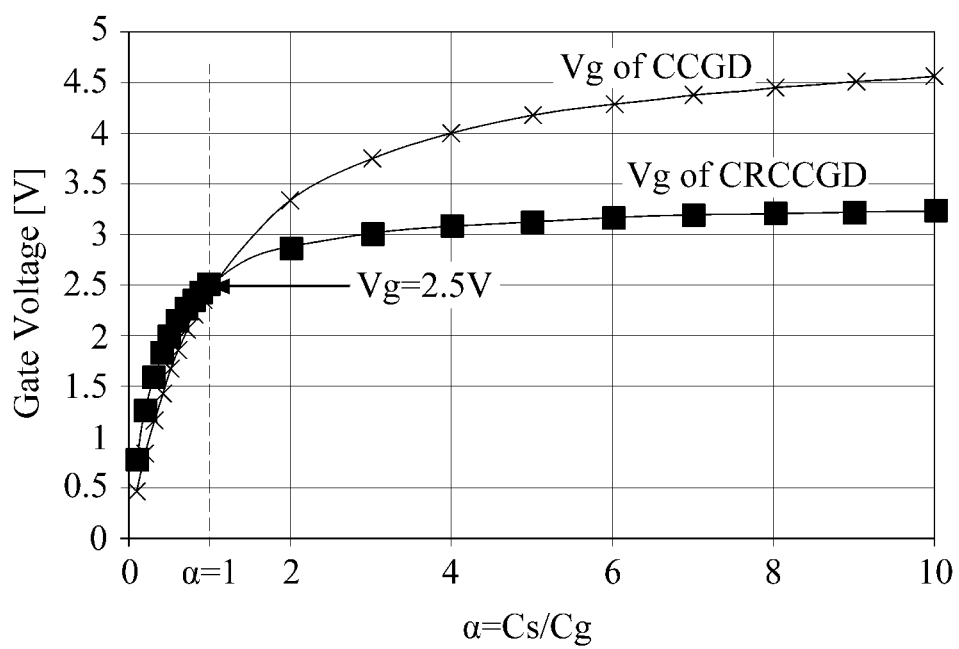
FIG. 12 is a graph showing the magnitude of gate voltage according to the capacity of capacitor Cs.

FIG. 12 is a graph showing the magnitude of gate voltage according to the capacity of capacitor Cs.

VDD is 5 V. In the case of CCGD, as α increases, the gate voltage becomes closer to VDD, and in the case of CRCCGD, ⅔*VDD is the maximum value. Where α=1, CCGD and CRCCGD both has the same Vg voltage, VDD/2.

Figure 13:
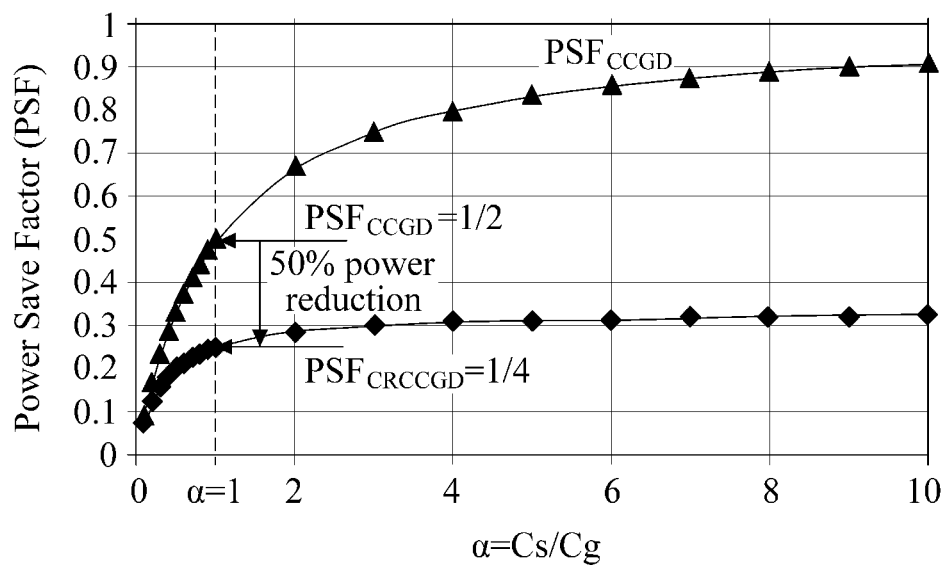
FIG. 13 is a graph showing PSF comparison between CRC-CGD and CCGD.

FIG. 13 is a graph showing PSF comparison between CRC-CGD and CCGD.

FIG. 13 shows variation in PSF according to the capacity of Cs. In the case of CCGD, as α increases, PSF becomes closer to 1, and consequently the power saving effect disappears. However, in the case of CRCCGD, since PSF is up to ⅓, an effect of an improvement of more than 67% is brought about even when any Cs is used. In the case of α=1, the two types have the same gate voltage, while PSF of CCGD is ½ and that of CRCCGD is ¼. In other words, CRCCGD shows an improvement of 50% in comparison with the CCGD and an improvement of 75% in comparison with the existing gate driver. In this case, the gate voltage is halved, and thus conduction loss is increased. The conduction loss at the time of driving at 2.5 V is increased by about 20%, while gate drive loss due to CRCCGD is reduced by 75%, and hence the overall efficiency is increased.

CCGD and CRCCGD are driven using Cs capacitor that is coupled to MOSFET to be driven, and hence if the Cs capacitor is fully charged, it is not possible to charge MOSFET gate any longer. If a drain voltage decreases at the moment of M1 being turned ON, the current flowing through Cgd increases in proportion to the variation of the drain voltage according to the Miller effect, thereby bringing about the effect of amplifying Cgd. Accordingly, the effect of increase in Cg is achieved, which is similar to the effect of decrease in a. Therefore, the gate voltage cannot rise enough and hence it is difficult to drive MOSFET. For this reason, CCGD and CRC-CGD are suitable to a ZVS application circuit which is turned ON when the drain potential of MOSFET is equal to the source potential, and in which the drain potential and the source potential are fixed.

Figure 14:
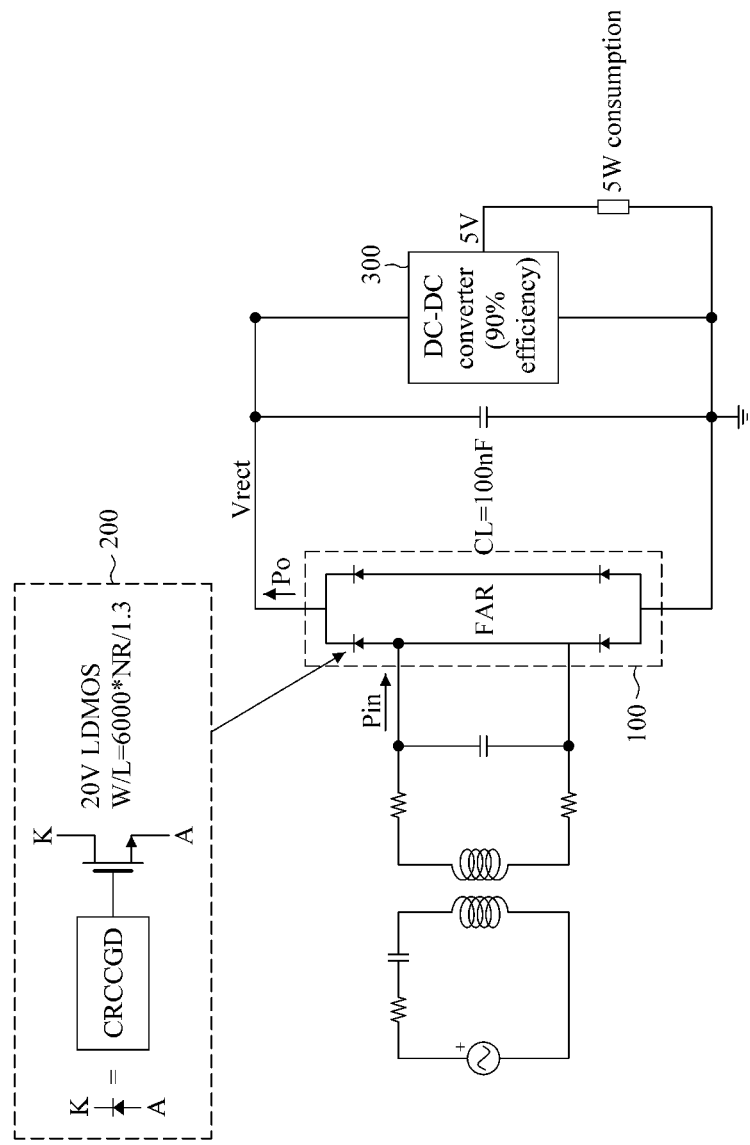
FIG. 14 is an active rectifier efficiency test circuit diagram.
Figure 15:
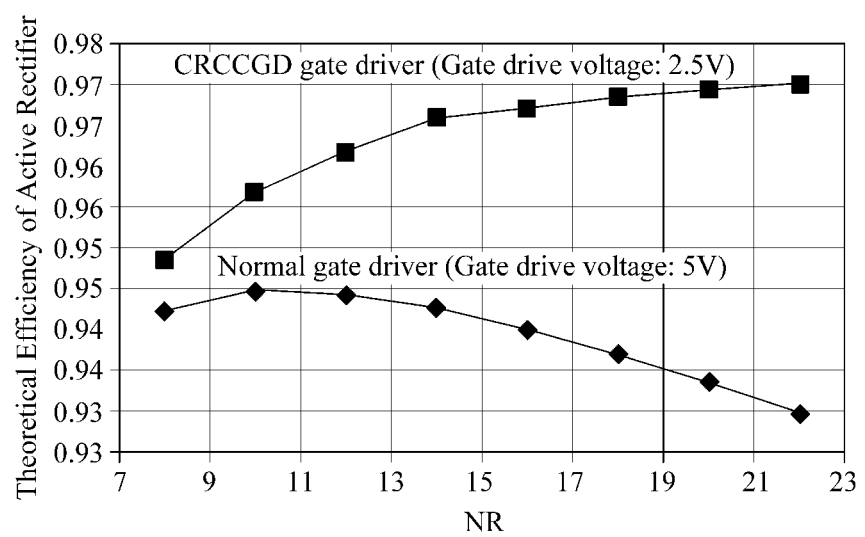
FIG. 15 is a graph showing the efficiency of an active rectifier.

FIG. 14 is an active rectifier efficiency test circuit diagram; and FIG. 15 is a graph showing the efficiency of an active rectifier.

In order to verify the efficiency improvement effect caused by CRCCGD, simulation of the efficiency of a magnetic resonance power transfer system in which the active rectifier is implemented, as shown in FIG. 14, was conducted. The active rectifier 100 was implemented using an active diode 200 consisting of MOSFTET and CRCCGD. The active diode was turned ON when voltages of both ends A and K were greater than 0, and since at the moment of being turned ON, ZVS requirements were satisfied, CRCCGD become usable. It is assumed that at the output, DC-DC converter 300 with efficiency of 90% supplies 5 W to the load. The power supplied from the active rectifier 100 thus becomes 5.5 W. The conditions for the simulation to compare the effects between the existing gate driver and CRCCGD are as follow:

(1) MOSFET: breakdown voltage of 20 V, W/L=6000*NR/1.3 [um/um]

(2) Input power source frequency: 6.78 MHz
→Hence, switching frequency of active rectifier becomes 6.78 MHz.

(3) NR: 8~22

(4) Rectifier output voltage (Vrect): ~8 V (5) $\alpha$ of CRCCGD: $\alpha=1$ (6) VDD of CRCCGD: 5 V (7) Efficiency of converter connected to active rectifier: 90%

(8) Power consumption of final load: 5 W

The gate voltage at the time when MOSFET of an active diode is driven using a general gate driver becomes 5V. On the other hand, in the case of CRCCGD, since $\alpha=1$, the gate driving voltage becomes 2.5 V by Equation 11. Hence, CRCCGD is inferior in terms of conduction loss, when compared to the implementation using the general gate driver. However, the switching frequency is 6.78 MHZ, which is very high, and thereby the gate drive loss becomes significantly high. The reduction in gate drive loss by CRCCGD may enhance the overall efficiency, thereby making it possible to achieve the result as shown in FIG. 14. It can be seen from the results of the simulation that, in all conditions, the efficiency of the circuit using CRCCGD is higher than the efficiency by the existing driver.

CCGD and CRCCGD both are based on a capacitor coupled driver, and, while somewhat increasing the conduction loss, the two still increase the overall efficiency by reducing the gate drive loss at a rate greater than the increase in conduction loss. Particularly, in the application that performs zero-voltage switching and drives, at high speed, switching devices whose inputs are isolated, such as, MOSFET and GaN device, CCGD and CRCCGD bring about the efficiency improvement effect in comparison to the existing methods.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A gate driver for driving a switching device, the gate driver comprising a capacitor coupled to an input of the switching device, and being configured to turn ON the switching device by supplying charge through the capacitor; to reserve charge charged in the capacitor when turning off the switching device; and to re-use the charge reserved in the capacitor when controlling the switching device to be turned ON again.

2. The gate driver of claim 1 being configured to allow the charge preserved in the capacitor to be shared with a parasitic capacitor when the gate driver controls the switching device to be turned ON again.

3. The gate driver of claim 2, wherein the parasitic capacitor of the switching device includes a gate-source parasitic capacitor and a gate-drain parasitic capacitor of the switching device.

4. The gate driver of claim 1, wherein the switching device performs zero-voltage switching and has an isolated input.

5. The gate driver of claim 1, wherein a capacity of the capacitor is set such that a rate of reduction in gate drive loss is higher than a rate of increase in conduction loss of the switching device.

* * * * *